(12) United States Patent
Ueno et al.

(10) Patent No.: US 6,777,622 B2
(45) Date of Patent: Aug. 17, 2004

(54) WIRING BOARDS

(75) Inventors: Yoshifumi Ueno, Kanuma (JP); Yokihiro Takikawa, Kanuma (JP)

(73) Assignee: Sony Chemicals, Corp., Tokyo (JP)

( * ) Notice: Subject to any disclaimer, the term of this patent is extended or adjusted under 35 U.S.C. 154(b) by 0 days.

(21) Appl. No.: 10/351,725

(22) Filed: Jan. 27, 2003

(65) Prior Publication Data

US 2003/0112617 A1 Jun. 19, 2003

Related U.S. Application Data

(63) Continuation of application No. PCT/JP01/06329, filed on Jul. 23, 2001.

(30) Foreign Application Priority Data

Jul. 27, 2000 (JP) ........................................ 2000-226495

(51) Int. Cl.[7] ................................................ H05K 7/06
(52) U.S. Cl. ...................................... 174/262; 174/266
(58) Field of Search .......................... 174/36, 250, 254, 174/255, 262–266; 361/749–751, 816, 820, 821

(56) References Cited

U.S. PATENT DOCUMENTS

| 4,801,489 A | * | 1/1989 | Nakagawa et al. ......... 428/209 |
| 6,040,524 A | * | 3/2000 | Kobayashi et al. ........... 174/36 |
| 6,486,394 B1 | * | 11/2002 | Schmidt et al. ............... 174/36 |

FOREIGN PATENT DOCUMENTS

| JP | 4-101316 | 9/1992 | |
| JP | 08-125380 | 5/1996 | ............ H05K/9/00 |
| JP | 8-125380 | 5/1996 | |
| JP | 2000-173355 | 6/2000 | |

OTHER PUBLICATIONS

Notification of Reason(s) for Refusal for Japanese Patent Application No. 2000–226495, mailed on May 6, 2003 (Japanese Language—2 pages); (English Language– 3 pages).
Patent Abstracts of Japan Publication No. 08–125380 published May 17, 1996 (1 page).
Partial Translation of Japanese Utility Model Laid Open Publication No. H04–101316 laid open date Sep. 1, 1992 (1 page).
Patent Abstracts of Japan Publication No. 2000–173355, published Jun. 23, 2000 (1 page).
PCT International Preliminary Examination Report dated Jul. 10, 2003, for corresponding PCT application no PCT/JP01/06329 (4 pages).
Patent Abstracts of Japan, Publication No. 08–125380, Publication Date May 17, 1996, 1 page.
Patent Abstracts of Japan, Publication No. 2000–173355, Publication Date Jun. 23, 2000, 1 page.
International Search Report prepared by Japanese Patent Office dated Oct. 10, 2001, together with English translation, 2 pages.

* cited by examiner

*Primary Examiner*—John B. Vigushin
(74) *Attorney, Agent, or Firm*—Osha & May L.L.P.

(57) ABSTRACT

In a flexible wiring board of the present invention, a first shield film is connected to a ground wiring at the bottom of an opening in a cover film. The first shield film is connected to a second shield film via a through-hole penetrating from the surface to the rear surface of a base film. Thus, the second shield film is connected to the ground wiring via the first shield film, whereby the wiring board can be wholly shielded.

17 Claims, 15 Drawing Sheets

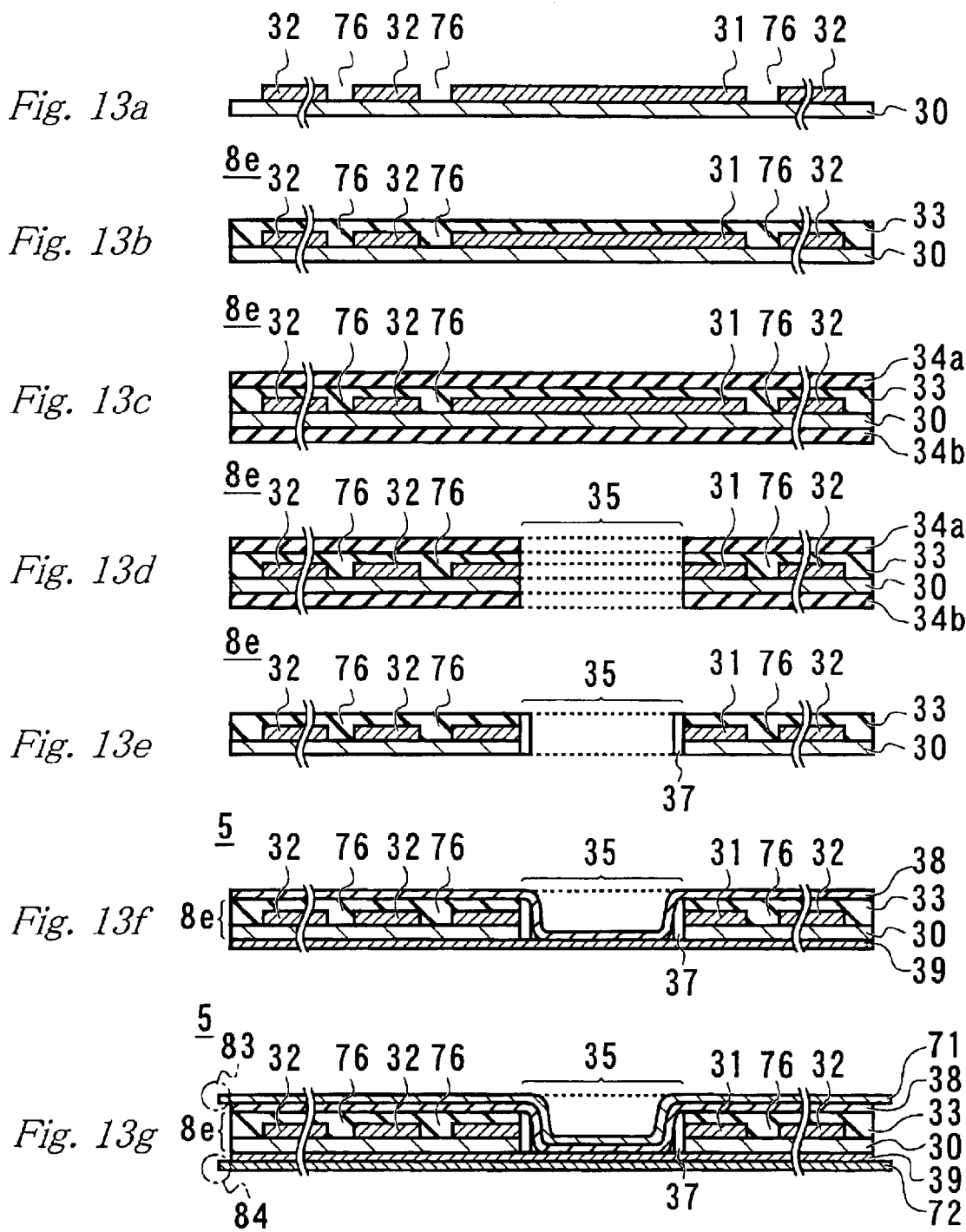

WIRING BOARDS

CROSS-REFERENCE TO RELATED APPLICATIONS

This application is a continuation of PCT Application No. PCT/JP01/06329 filed Jul. 23, 2001.

BACKGROUND OF INVENTION

The present invention relates to wiring boards with an electromagnetic shield, particularly wiring boards with an electromagnetic shield of easy grounding.

BACKGROUND ART

Wiring boards consisting of a plurality of parallel lines have been widely used as flat cables.

Reference 101 in FIG. 15 represents a conventional flat cable comprising a plurality of lines 112 longitudinally arranged in parallel on an elongate base film 111. Ten lines 112 are shown in this figure.

A cover film 113 is applied on lines 112 except both ends of lines 112, so that the part of each line 112 covered with cover film 113 forms a signal member 122 and both ends not covered with cover film 113 form pad members 121.

In order to electrically connect electric circuits using this flat cable 101, pad member 121 at one end of flat cable 101 is connected to one electric circuit and pad member 121 at the other end is connected to the other electric circuit.

Each line 112 consists of a copper foil having a thickness of several tens of micrometers, and line 112, base film 111 and cover film 113 are flexible so that flat cable 101 can be folded to connect electric circuits.

Flat cable 101 as described above has been used in various devices in recent years and raised the problem that flat cable 101 picks up noises.

If flat cable 101 were wholly covered with a metal foil, the metal foil could serve as an electromagnetic shield but a complex operation would be required for connecting the metal foil to lines at ground potential.

What is needed, therefore, is a flat cable having an electromagnetic shield that can be connected to ground wirings without any special operation.

SUMMARY OF INVENTION

An aspect of the present invention provides a wiring board comprising a wiring board body having a base film, a plurality of metal lines provided on the base film and a cover film provided on the side of the base film having the metal lines, and a first shield film and a second shield film provided on the side of the wiring board body having the cover film and the opposite side, respectively, wherein the cover film has an opening formed at a predetermined location above the metal lines so that the first shield film is connected to the metal line exposed under the opening, and the wiring board body has a through-hole penetrating at least the base film and the cover film so that the first and second shield films are connected to each other via the through-hole.

In an embodiment of the wiring board of the present invention, the through-hole also penetrates the metal line in addition to the cover film and the base film.

In an embodiment of the wiring board of the present invention, the through-hole and the opening at least partially overlap each other.

In an embodiment of the wiring board of the present invention, the through-hole is smaller than the opening and the through-hole is provided inside the opening.

In an embodiment of the wiring board of the present invention, the metal lines are provided on both sides of the base film.

In an embodiment of the wiring board of the present invention, the metal lines comprise a plurality of signal wirings and at least one ground wiring wider than the signal wirings and the opening is provided above the ground wiring.

In an embodiment of the wiring board of the present invention, the signal wirings have a narrow conductor part and a terminal part connected to each end of the narrow conductor part and wider than the narrow conductor part.

In an embodiment of the wiring board of the present invention, the ground wiring has a wide conductor part and a terminal part connected to each end of the wide conductor part and narrower than the wide conductor part.

In an embodiment of the wiring board of the present invention, the ground wiring has a wide conductor part and a terminal part connected to each end of the wide conductor part and narrower than the wide conductor part, and the terminal part of the signal wirings and the terminal part of the ground wiring have approximately the same width.

In an embodiment of the wiring board of the present invention, the through-hole penetrates the wide conductor part of the ground wiring.

Another aspect of the present invention provides a wiring board comprising a wiring board body having a base film, a plurality of metal lines provided on the base film and a cover film provided on the side of the base film having the metal lines, and a first shield film and a second shield film provided on the side of the wiring board body having the cover film and the opposite side, respectively, wherein the wiring board body has a through-hole provided at a predetermined location on the metal lines and penetrating the base film, the cover film and the metal line, and a metal film is formed on the inner circumferential face of the through-hole and connected to the metal line exposed on the inner circumferential face of the through-hole, and the first and second shield films are connected to each other via the through-hole and at least one shield film is connected to the metal film.

In the wiring board according to this aspect, the metal lines may be provided on both sides of the base film.

According to the present invention as defined above, the first shield film and the ground wiring are connected at the bottom of the opening provided in the cover film or within the hole provided in the cover film, and the first and second shield films are connected to each other via the hole.

Thus, the first and second shield films are connected to the ground wiring without any special member, whereby a wiring board with high reliability can be easily prepared.

BRIEF DESCRIPTION OF DRAWINGS

FIG. 13(a) is a diagram for illustrating a step (1) of a process for manufacturing a wiring board of a fifth example of the present invention.

FIG. 13(b) is a diagram for illustrating a step (2) of the process for manufacturing the wiring board of the fifth example of the present invention.

FIG. 13(c) is a diagram for illustrating a step (3) of the process for manufacturing the wiring board of the fifth example of the present invention.

FIG. 13(d) is a diagram for illustrating a step (4) of the process for manufacturing the wiring board of the fifth example of the present invention.

FIG. 13(e) is a diagram for illustrating a step (5) of the process for manufacturing the wiring board of the fifth example of the present invention.

FIG. 13(f) is a diagram for illustrating a step (6) of the process for manufacturing the wiring board of the fifth example of the present invention.

FIG. 13(g) is a diagram for illustrating a step (7) of the process for manufacturing the wiring board of the fifth example of the present invention.

Figure 1A:
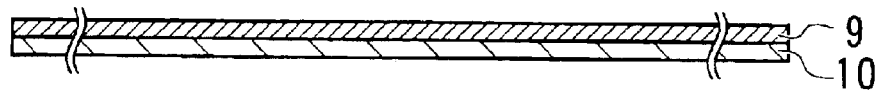
FIG. 1(a) is a sectional view (1) for illustrating a process for manufacturing a wiring board of a first example of the present invention.

Various references in the drawings represent the following elements: 1–6, wiring board; 8a–8f, wiring board body; 10, 20, 30, 40, base film; 11, 11b, 21, 31, 41, ground wiring; 12, 22a, 22b, 32, 42, signal wiring; 13, 23, 33, 43, cover film; 14, 14a, 24a, 24b, 44, opening; 15, 25, 35, 45, through-hole; 18, 28, 38, 48, first shield film; 19, 29, 39, 49, second shield film; 61, wide conductor part; 62a, 62b, 64a, 64b, terminal part; 63, narrow conductor part.

DETAILED DESCRIPTION

Wiring boards of the present invention are explained together with manufacturing processes thereof.

Referring to FIG. 1(a), reference 10 represents a base film having a thickness of 10–100 μm consisting of a resin such as polyester or polyimide. An adhesive layer is formed on the surface of base film 10, and a copper foil 9 having a thickness of about 50 μm is applied on the side of base film 10 having the adhesive layer.

Figure 1B:
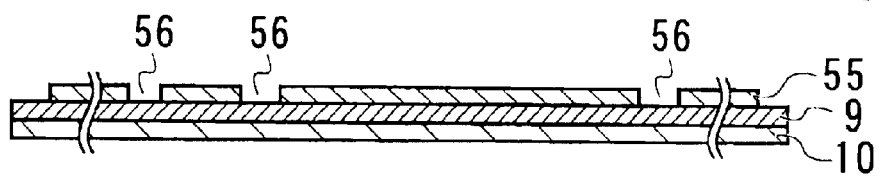
FIG. 1(b) is a sectional view (2) for illustrating the process for manufacturing the wiring board of the first example of the present invention.

A patterned resist film 55 is formed on copper foil 9 as shown in FIG. 1(b). Openings 56 are formed in resist film 55 to expose copper foil 9 at the bottoms of openings 56.

The assembly as such is immersed in an etching solution to etch off copper foil 9 exposed at the bottoms of openings 56 so that copper foil 9 is patterned, and then resist film 55 is removed.

Figure 1C:
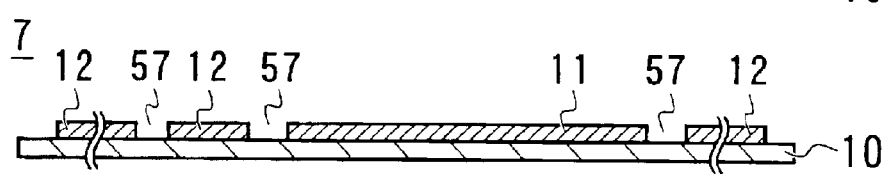
FIG. 1(c) is a sectional view (3) for illustrating the process for manufacturing the wiring board of the first example of the present invention.
Figure 1D:
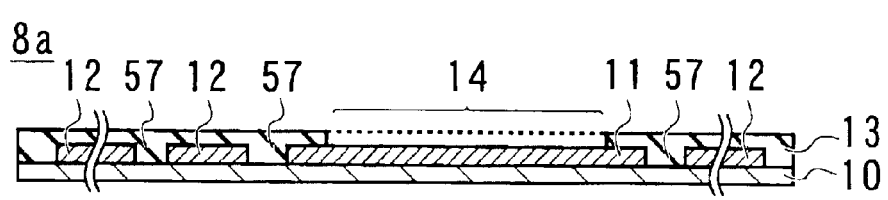
FIG. 1(d) is a sectional view (4) for illustrating the process for manufacturing the wiring board of the first example of the present invention.
Figure 1E:
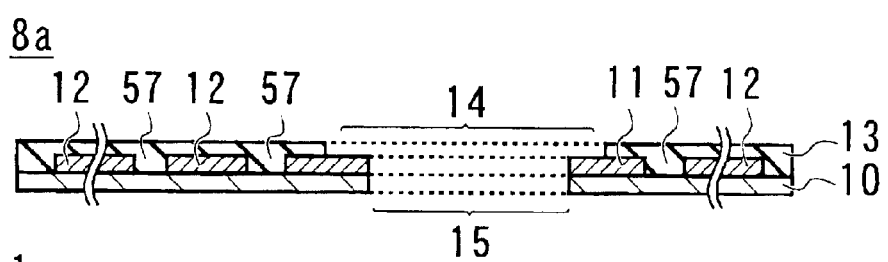
FIG. 1(e) is a sectional view (5) for illustrating the process for manufacturing the wiring board of the first example of the present invention.
Figure 1F:
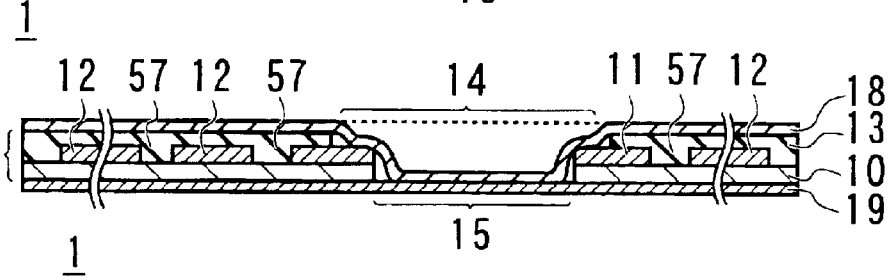
FIG. 1(f) is a sectional view (6) for illustrating the process for manufacturing the wiring board of the first example of the present invention.
Figure 1G:
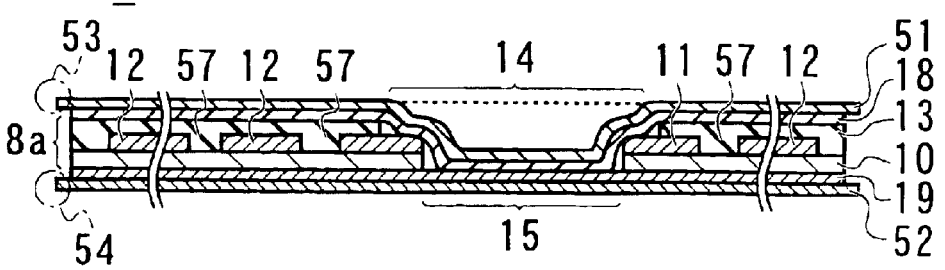
FIG. 1(g) is a sectional view (7) for illustrating the process for manufacturing the wiring board of the first example of the present invention.
Figure 2:
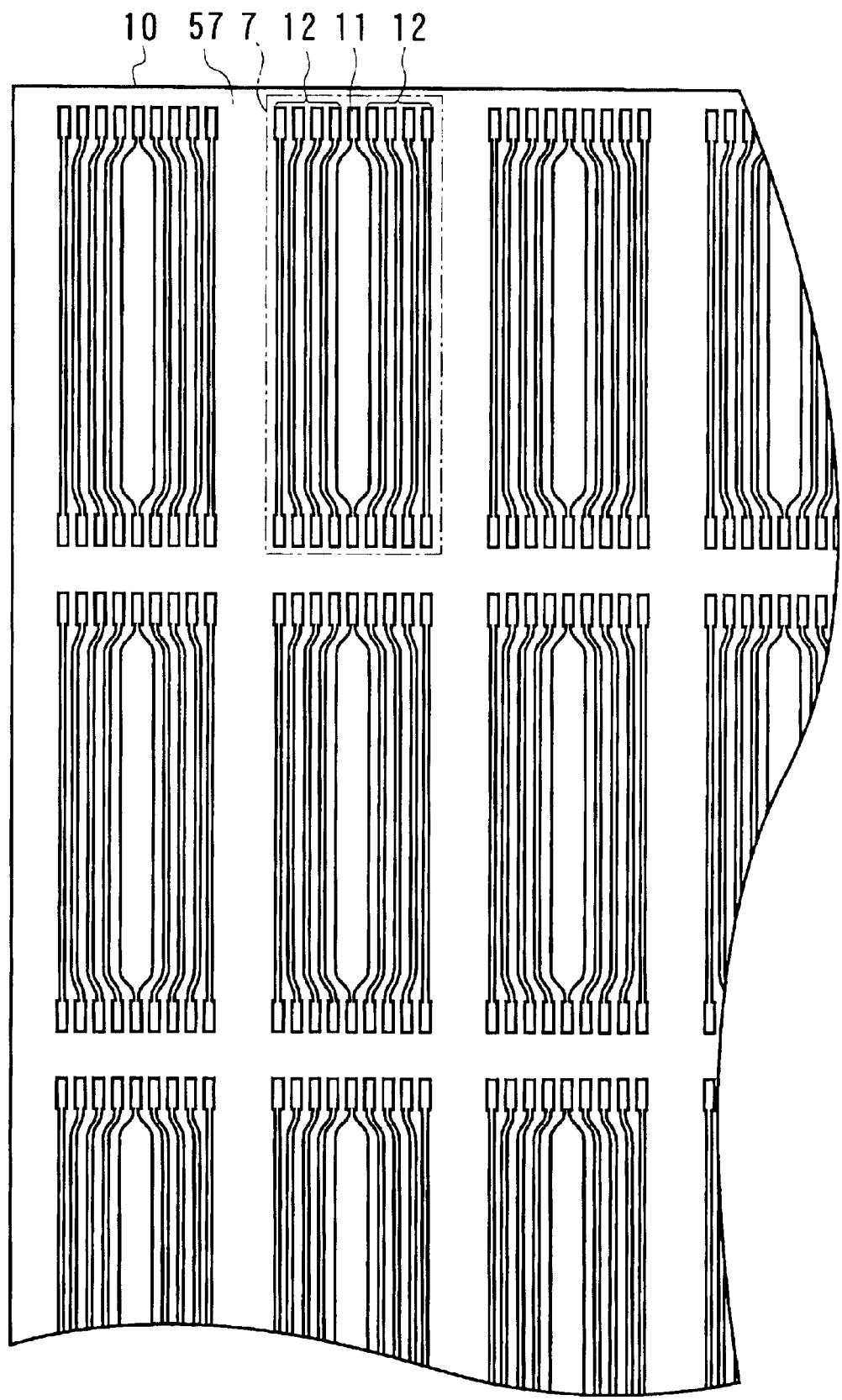
FIG. 2 is a plan view corresponding to FIG. 1(c).
Figure 4:
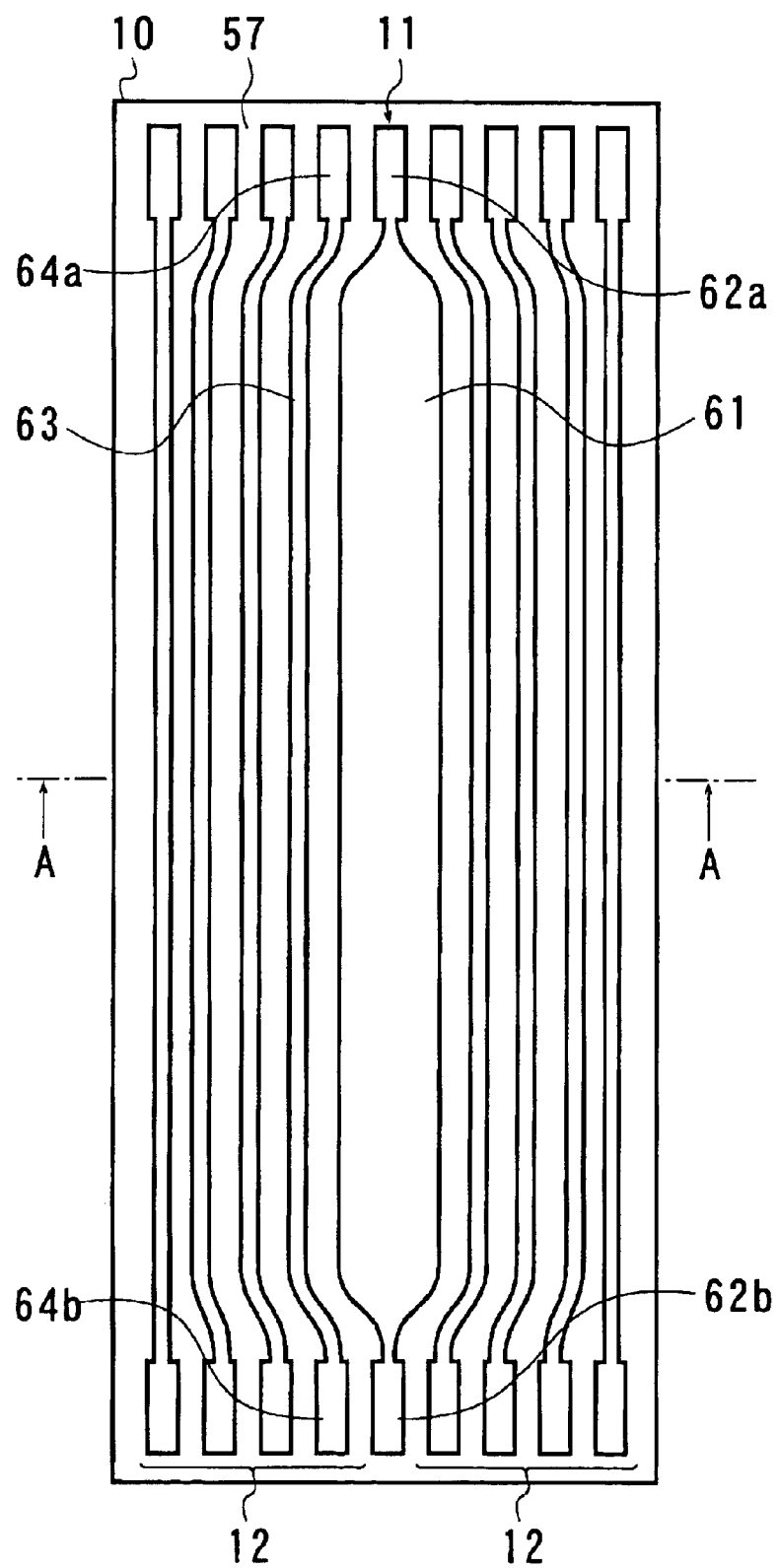
FIG. 4 is an enlarged view of FIG. 2.

FIG. 2 is a plan view of a part of base film 10 in this state. Reference 7 in this figure represents a module to be worked into a wiring board by the process described below, and FIG. 4 is an enlarged plan view of one module 7. FIG. 1(c) is a sectional view taken along A—A line in FIG. 4. Similarly, FIGS. 1(d)–(f) described below are sectional views taken along A—A lines in FIGS. 5–7, respectively.

Here, a plurality of modules 7 of a wiring board are arranged in a matrix on a single base film 10.

As shown in FIG. 1(c), FIG. 2 and FIG. 4, grooves 57 are formed by etching off copper foil 9, and a plurality of ground wirings 11 and signal wirings 12 are formed of patterned copper foil 9. Ground wirings 11 and signal wirings 12 are separated by grooves 57.

Each module 7 contains one ground wiring 11 and a plurality of (eight, here) signal wirings 12. Ground wiring 11 and signal wirings 12 extend in the same direction.

Generally, flat cables like wiring boards of the present invention contain one or two ground wirings 11 and many signal wirings 12. Ground wiring 11 and signal wirings 12 are provided inside the edge of base film 10.

Ground wiring 11 and each signal wiring 12 extend in the same direction, and ground wiring 11 is provided at the center and four signal wirings 12 are provided on each side of the ground wiring. Ground wiring 11 and signal wirings 12 are separated and insulated by grooves 57 from each other as well as individual signal wirings 12.

Each of ground wiring 11 and signal wirings 12 has an elongate conductor part 61, 63 and terminal parts 62a, 62b, 64a, 64b connected to both ends of conductor part 61, 63.

Each terminal part 62a, 62b, 64a, 64b has an equal width and an equal length, here a width of about 1 mm and a length of about 3 mm.

The widths and lengths of terminal parts 62a, 62b, 64a, 64b typically differ by only a patterning error or etching error caused during the process of etching a metal foil to form ground wiring 11 and signal wirings 12.

The distance between adjacent terminal parts among 62a, 62b, 64a, 64b is normally about 40% to 60% of the width of conductor part 63 of signal wiring 12 and therefore narrower than 1 mm.

Conductor part 61 of ground wiring 11 has a width larger than that of each terminal part 62a, 62b, 64a, 64b for ease of forming a through-hole 15 described below. The width is here about 5 mm.

On the other hand, conductor part 63 of signal wiring 12 has a width smaller than that of terminal parts 62a, 62b, 64a, 64b, and is convex toward the outside of base film 10 to detour wide conductor part 61.

In flat cables like wiring boards of the present invention, terminal parts 62a, 62b, 64a, 64b should be wide enough to ensure reliable electric connection to electric circuits to be connected. However, conductor part 63 of signal wiring 12 can be narrowed to the process limit. Thus, the large width of conductor part 61 of a single ground wiring 11 is absorbed by narrow conductor part 63 of a plurality of signal wirings 12 even when terminal parts 62a, 62b, 64a, 64b are arranged side by side as close as possible. Therefore, the width of the area containing conductors 61, 63 is not larger than the width of the area containing terminal parts 62a, 62b, 64a, 64b.

Figure 3:
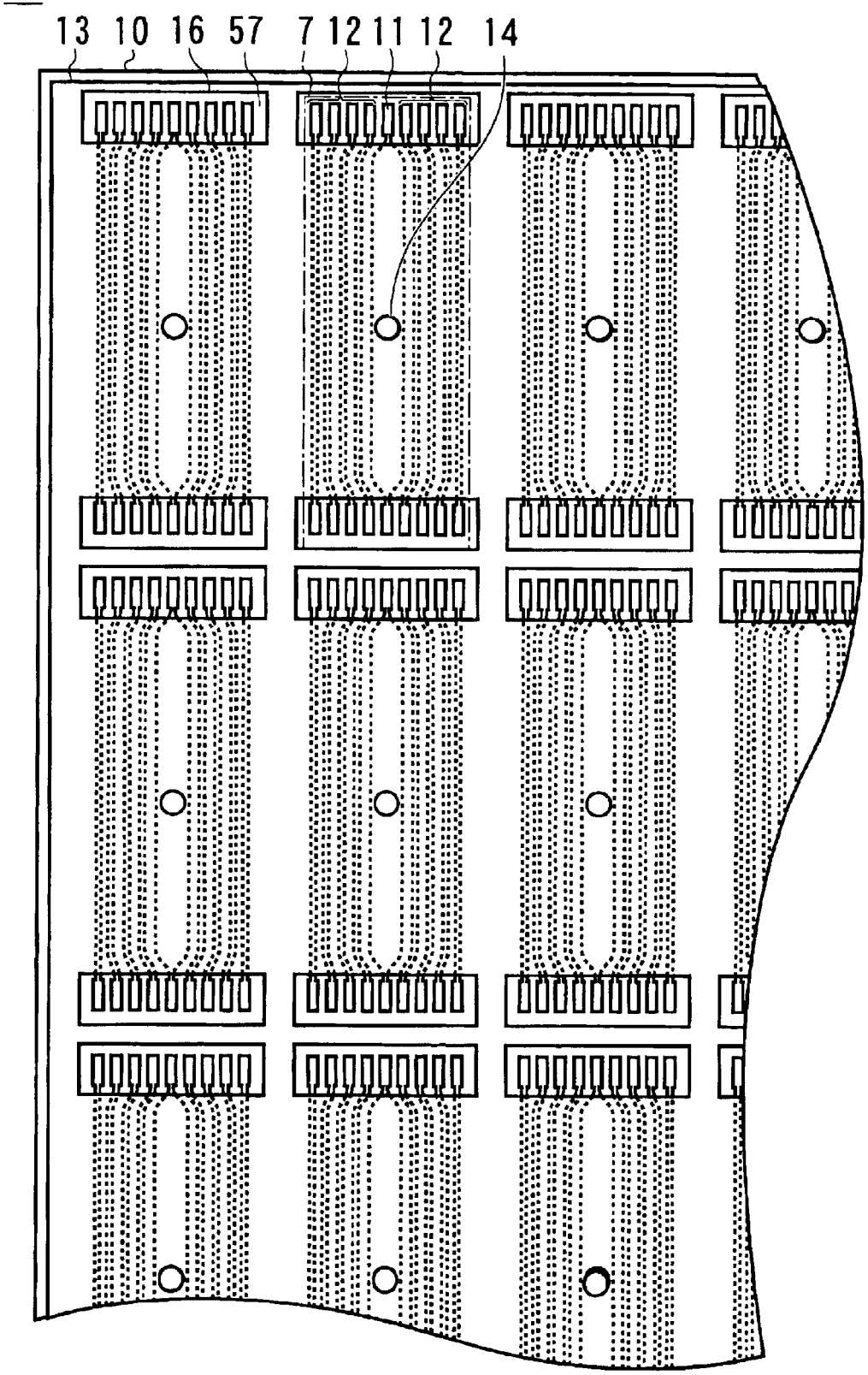
FIG. 3 is a plan view corresponding to FIG. 1(d).

Then, cover film 13 made of a resin such as polyester or polyimide having a thickness of 10–100 μm and having an insulating adhesive layer preformed on one side is spread over the side of base film 10 having ground wiring 11 and signal wirings 12, and the side of cover film 13 having the adhesive layer is brought into close contact with the side of base film 10 having ground wiring 11 and signal wirings 12 while adjusting the alignment and the cover film is bonded to the base film by heating under pressure, as shown in FIG. 3.

This cover film 13 has through-holes in the thickness direction, some of these through holes become openings 14 described below and other through-holes become windows 16 described below.

Through-holes to become openings 14 are provided in a ratio of one through-hole to become opening 14 to one module 7. The through-holes to become openings 14 have a round shape having a diameter of about 4 mm that is smaller than the width of conductor part 61 of ground wiring 11 and are arranged at the same intervals as those between ground wirings 11.

Through-holes to become windows 16 are provided in a ratio of two through-holes to become windows 16 to one module 7. The through-holes to become windows 16 are rectangular and the distance between the centers of such two through-holes is approximately equal to the distance between terminal parts 62a, 64a at one end of ground wiring 11 and signal wiring 12 and terminal parts 62b, 64b at the opposite end.

Such a cover film 13 is aligned in such a manner that one of two through-holes forming windows 16 overlies terminal parts 62a, 64a at one end and the other overlies terminal parts 62b, 64b at the other end, and cover film 13 is applied to the surfaces of base film 10, ground wiring 11 and signal wirings 12, whereby one round through-hole of cover film 13 overlies each conductor part 61 of ground wiring 11 and a closed-end opening 14 is formed by the one round through-hole and ground wiring 11. Thus, the surface of conductor part 61 of ground wiring 11 is exposed at the bottom of this opening 14.

The size of the through-hole forming window 16 is greater than the width and the length of the area containing terminal parts 62a, 62b, 64a, 64b of ground wiring 11 and signal wirings 12. When cover film 13 is applied, a closed-end window 16 is thus formed by the through-hole at each end of ground wiring 11 and signal wirings 12, terminal parts 62a, 62b, 64a, 64b located at the bottom of the through-hole and the surface of base film 10.

As a result, a wiring board body 8a is obtained comprising base film 10, ground wiring 11, signal wirings 12, cover film 13, opening 14 exposing the surface of conductor part 61 of ground wiring 11 at the bottom, and windows 16 exposing the surfaces of terminal parts 62a, 62b, 64a, 64b and the surface of base film 10 at the bottom, as shown in FIG. 1(d).

Figure 5:
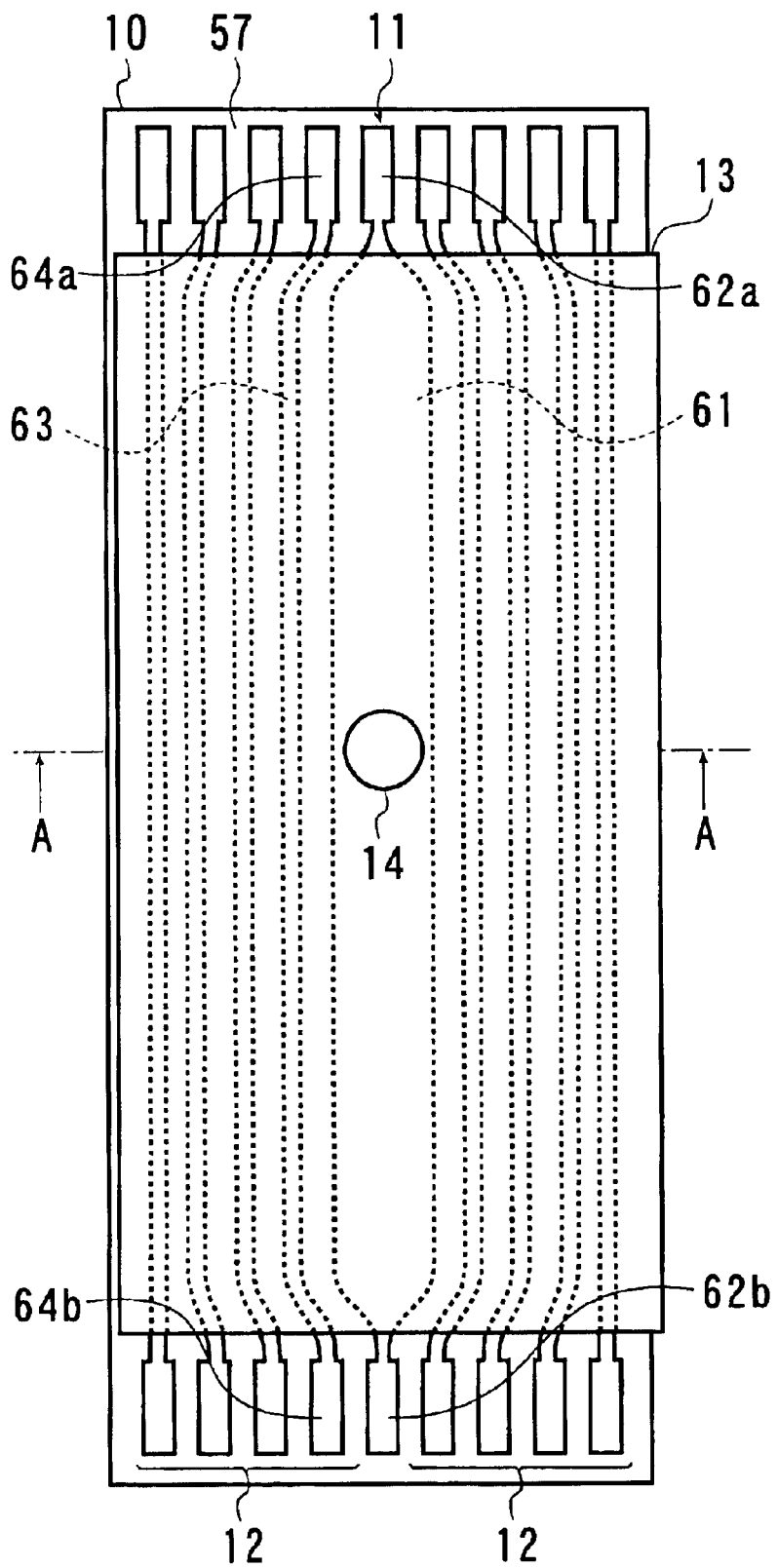
FIG. 5 is an enlarged view of FIG. 3.

FIG. 3 is a plan view showing this state, FIG. 5 is a partial enlarged view of wiring board body 8a, and FIG. 1(d) is a sectional view taken along A—A line in FIG. 5.

The diameter of opening 14 here is smaller than the width of conductor part 61 of ground wiring 11 so that the surface of base film 10 is not exposed.

Figure 6:
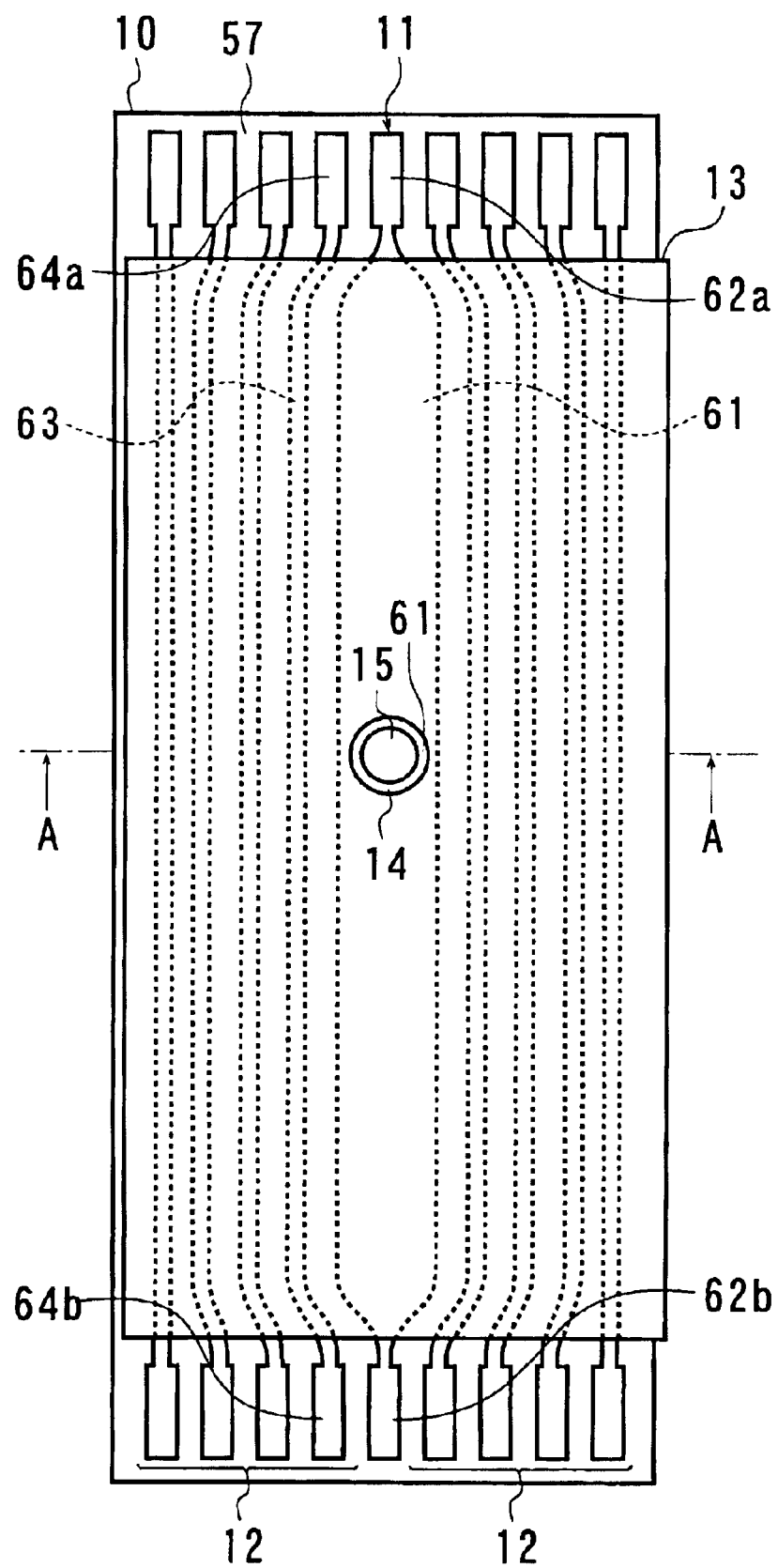
FIG. 6 is an enlarged plan view corresponding to FIG. 1(e).

Then, wiring board body 8a is pierced at the location of the bottom of opening 14 to form a through-hole 15 having a diameter smaller than that of opening 14 in ground wiring 11 exposed at the bottom of opening 14 and base film 10 underlying it, as shown in FIG. 1(e) and FIG. 6. Round through-hole 15 having a diameter of about 3 mm and concentric with opening 14 is here formed, so that the outer periphery of through-hole 15 is inside the edge of opening 14 and therefore, through-hole 15 is located inside opening 14.

As through-hole 15 is smaller than opening 14 and through-hole 15 is located inside opening 14, a section of conductor part 61 of ground wiring 11 and a section of base film 10 are exposed at the inner circumferential face of through-hole 15 and the surface of conductor part 61 of ground wiring 11 in an area corresponding to the difference between the diameter of through-hole 15 and the diameter of opening 14 is exposed at the periphery of the opening of through-hole 15 on the side of ground wiring 1.

Figure 7:
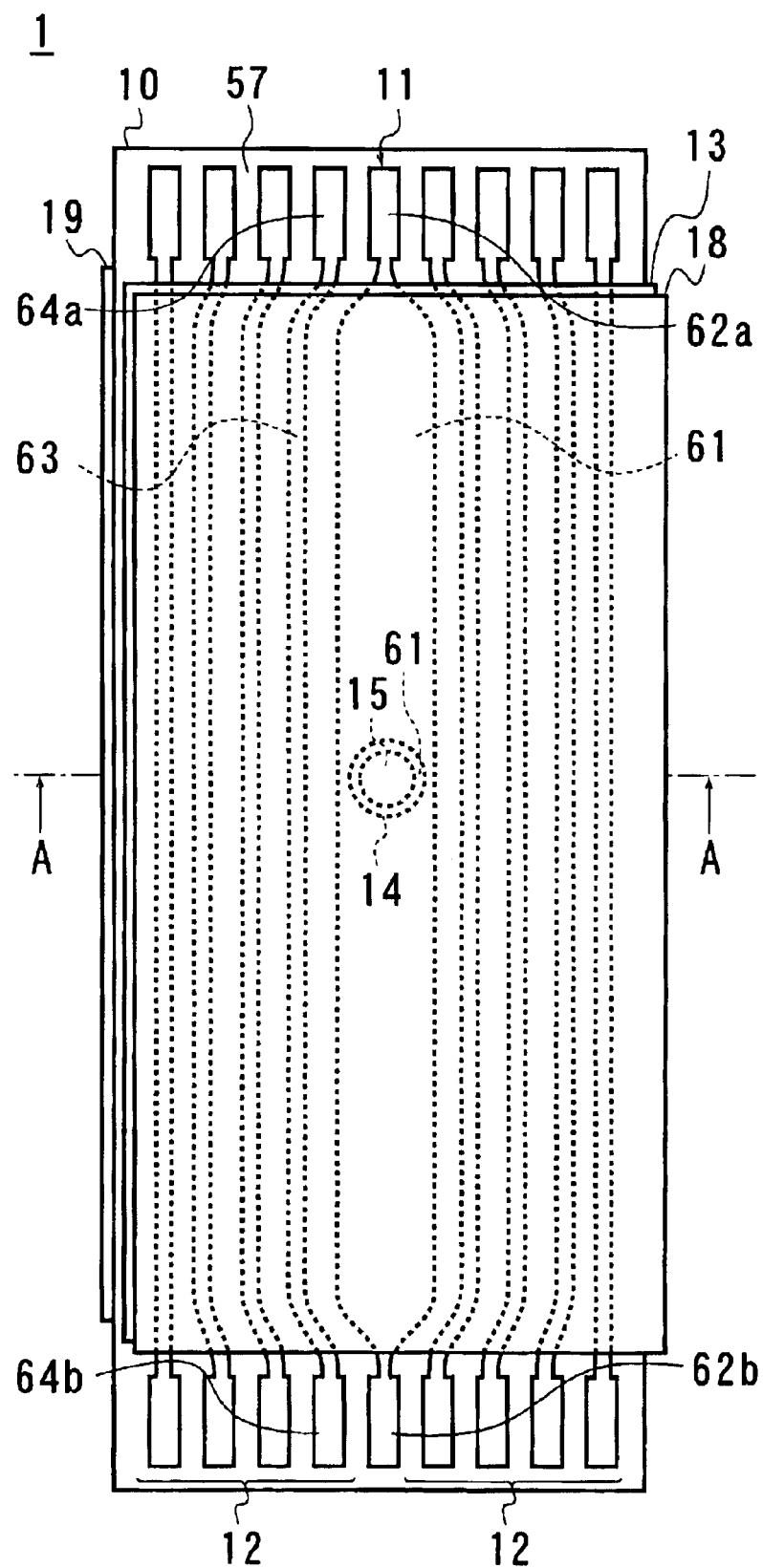
FIG. 7 is an enlarged plan view corresponding to FIG. 1(f).

Two shield films comprising a conductive adhesive applied on a rolled copper foil or the like having a thickness of 20–40 μm, one called first shield film 18 and the other called second shield film 19, are prepared and first and second shield films 18, 19 are applied on the surface of cover film 13 and the rear surface of base film 10, respectively, as shown in FIG. 1(f) and FIG. 7.

The length of first and second shield films 18, 19 in the direction along ground wiring 11 and signal wirings 12 is here equal to or less than that of cover film 13, so that terminal parts 62a, 62b, 64a, 64b are exposed at the surface and first and second shield films 18, 19 are kept out of contact with terminal parts 62a, 62b, 64a, 64b.

First and second shield films 18, 19 are applied and then the area of first shield film 18 overlying through-hole 15 is pressed.

As the diameter of through-hole 15 is much greater than the thickness of base film 10, cover film 13 and copper foil, first shield film 18 is pushed into through-hole 15 and adhered to second shield film 19 at the rear surface of base film 10 when it is pressed, whereby first and second shield films 18, 19 are electrically connected to each other.

When first shield film 18 is pushed into through-hole 15, first shield film 18 is also adhered to the surface of conductor part 61 of ground wiring 11 exposed at the periphery of the opening of through-hole 15, whereby it is electrically connected to ground wiring 11, with the result that second shield film 19 is connected to ground wiring 11 via first shield film 18.

After first and second shield films 18, 19 are connected to ground wiring 11, they are cut into modules 7 to give a wiring board 1 of a first example of the present invention.

As first and second shield films 18, 19, ground wiring 11 and signal wirings 12 consist of a thin copper foil 9 and base film 10 and cover film 13 consist of a thin resin film, they are all flexible. Thus, this wiring board 1 and wiring boards 2–6 of various examples of the present invention described below are flexible.

Base film 10 and cover film 13 of wiring boards 1–6 of the present invention have an equal width because modules 7 arranged in a matrix are cut and separated from each other. First and second shield films 18, 19 also have an equal width. Thus, signal wirings 12 and ground wiring 11 are sandwiched between first and second shield films 18, 19 even when wiring boards 1–6 are separated from a stock sheet.

Ground wiring 11 and signal wirings 12 can be unexposed at cut surfaces because modules 7 are cut at the position between of them.

Such a wiring board 1 is used in an electronic device by connecting terminal part 62a, 64a at one end to one circuit and terminal part 62b, 64b at the other end to another electronic circuit to electrically connect both electronic circuits.

During then, terminal part 63 of signal wiring 12 is connected to I/O signal terminals of an electronic circuit and used for signal transmission while terminal part 61 of ground wiring 11 is connected to the ground terminal of the electronic circuit and placed at ground potential.

As a result, first and second shield films 18, 19 are placed at ground potential to serve as a shield against electromagnetic noises entering signal wirings 12.

If necessary, durability can be improved by applying protective films 51, 52 consisting of a resin film or the like on the surfaces of first and second shield films 18, 19 except terminal parts 62a, 62b, 64a, 64b.

Protective films 51,52 can be applied before or after wiring board 1 is cut and separated.

In the case where they are applied after separation, it is convenient to use insulating protective films 51, 52 having a width larger than that of first and second shield films 18, 19 and having an edge projecting from first and second shield films 18, 19 outward in the width direction to form projection 53, 54, which prevent first and second shield films 18, 19 from coming into contact with any other lines in electronic devices.

The width and length of wiring board 1 described above may vary, and as a practical example, the length in the direction along ground wiring 11 and signal wirings 12 is about 10 cm and the width is about 1 cm.

Although conductor part 61 of ground wiring 11 is wide along almost the whole length in wiring board 1 described above, it may be wide only in the area containing opening 14 while the remaining area may have approximately the same width as that of conductor part 63 of signal wiring 12. What is important is that ground wiring 11 is at least partially exposed at the bottom of opening 14.

Although the outer periphery of through-hole 15 is inside the edge of opening 14 and through-hole 15 is located inside opening 14 in wiring board 1 of the first example described above, any variations may be included in wiring board 1 of the present invention so far as through-hole 15 and opening 14 at least partially overlap each other and ground wiring 11 is at least partially exposed at the bottom of opening 14 and through-hole 15 penetrates from the surface to the rear surface of wiring board body 8a.

Figure 8:
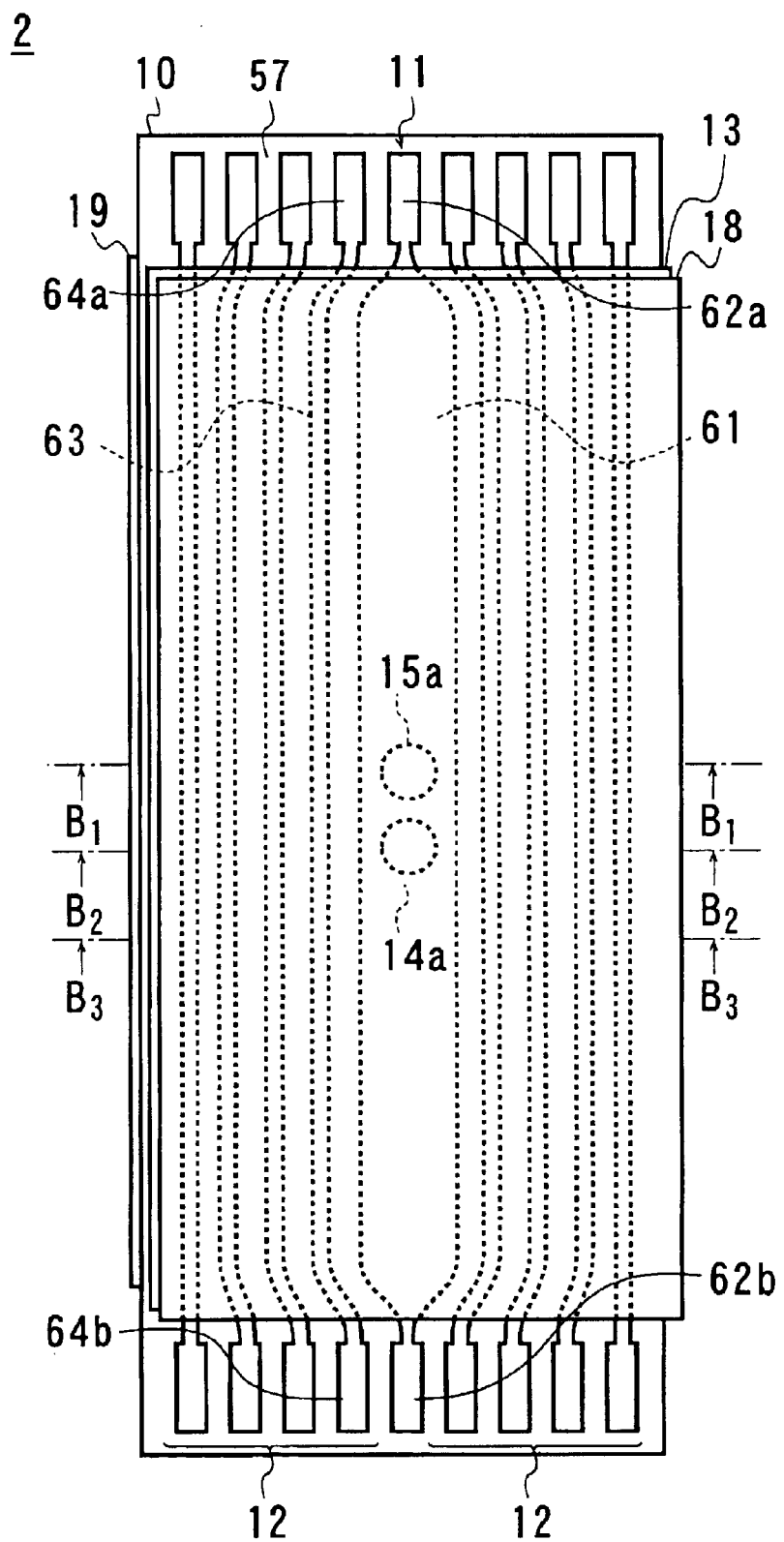
FIG. 8 is a plan view for illustrating a wiring board of a second example of the present invention.

Next, a wiring board of a second example of the present invention is explained. FIG. 8 is a plan view of such a wiring board 2 in which the same elements as those of wiring board 1 of the first example are designated by the same references and not explained.

In contrast to wiring board 1 of the first example in which through-hole 15 is formed inside opening 14, in wiring board 2, opening 14a in cover film 13 is formed above wide conductor part 61 of ground wiring 11 but through-hole 15a is apart from opening 15a. This through-hole 15a penetrates cover film 13, wide conductor part 61 of ground wiring 11 and base film 10.

Figure 9A:
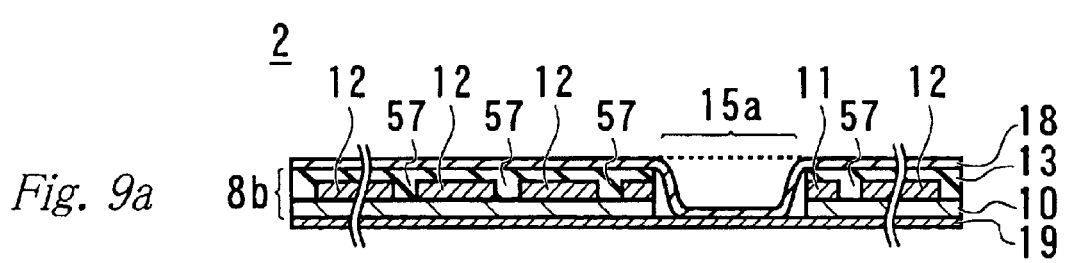
FIG. 9(a) is a sectional view taken along $B_1$—$B_1$ line in FIG. 8.
Figure 9B:
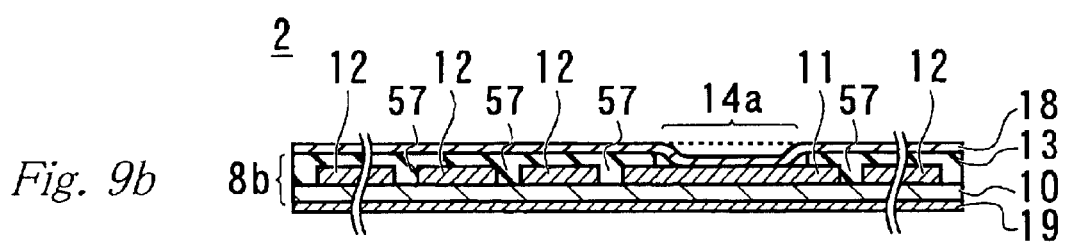
FIG. 9(b) is a sectional view taken along $B_2$—$B_2$ line in FIG. 8.
Figure 9C:
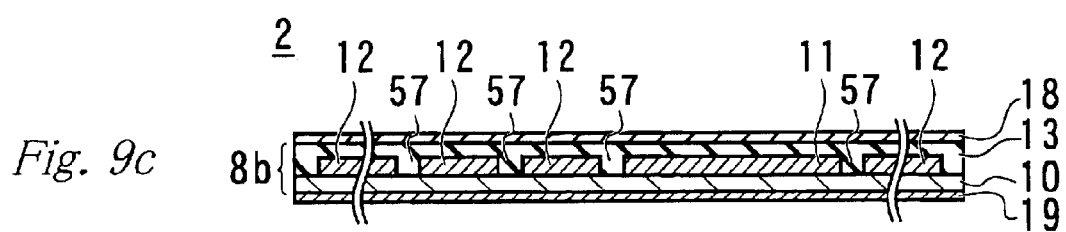
FIG. 9(c) is a sectional view taken along $B_3$—$B_3$ line in FIG. 8.

FIGS. 9(a)–(c) show sectional views of wiring board 2 shown in FIG. 8. FIG. 9(a) is a sectional view taken along $B_1$—$B_1$ line passing through through-hole 15a, FIG. 9(b) is a sectional view taken along $B_2$—$B_2$ line passing through opening 14a, and FIG. 9(c) is a sectional view taken along $B_3$—$B_3$ line passing through a section not containing opening 14a and through-hole 15a.

Reference 8b in FIGS. 9(a)–(c) represents a wiring board body comprising base film 10, ground wiring 11 and signal wirings 12 and cover film 18.

First shield film 18 applied on cover film 13 is connected to ground wiring 11 in the area exposed at the bottom of opening 14a, and first shield film 18 is pushed into through-hole 15a and connected at the bottom of through-hole 15a to second shield film 19 applied on base film 10.

Similarly to wiring board 1 of the first example, first shield film 18 applied on cover film 13 is directly connected to ground wiring 11 and second shield film 19 applied on base film 10 is connected to ground wiring 11 via first shield film 18 in wiring board 2 of this second example.

Although through-hole 15 is formed inside opening 14 in wiring board 1 of the first example and opening 14a and through-hole 15a are apart from each other in wiring board 2 of the second example, the opening and through-hole may partially overlap each other.

Figure 10:
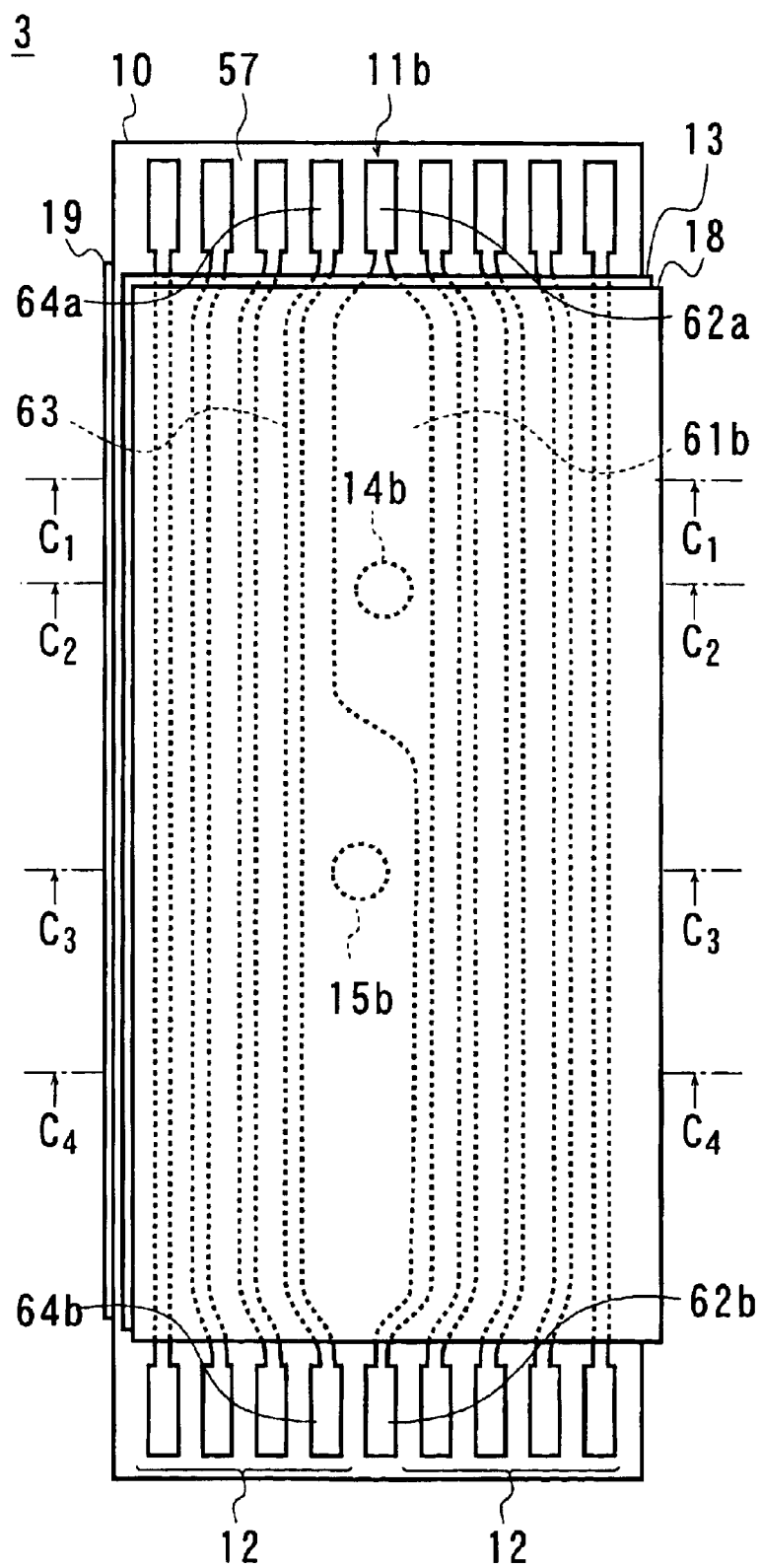
FIG. 10 is a plan view for illustrating a wiring board of a third example of the present invention.

Next, a wiring board of a third example of the present invention is explained. Reference 3 in FIG. 10 represents a wiring board of the third example. In wiring board 3 of the third example, the same elements as those of wiring board 1 of the first example are designated by the same reference and not explained.

In wiring board 3 of the third example, conductor part 61b of ground wiring 11b has a wide area and a narrow area, and opening 14b in cover film 13 is located above the wide area, and the surface of conductor part 61b is exposed at the bottom.

In this wiring board 3, cover film 13 is applied on the side of base film 10 having ground wiring 11b and signal wirings 12 and then the location detouring ground wiring 11b and signal wirings 12, ie, the location between the narrow area of conductor part 61b of ground wiring 11b and the adjacent signal wiring 12 is pierced to form a through-hole 15b penetrating cover film 13 and base film 10.

FIGS. 11(a)–(d) show sectional views of wiring board 3 shown in FIG. 10.

Figure 11A:
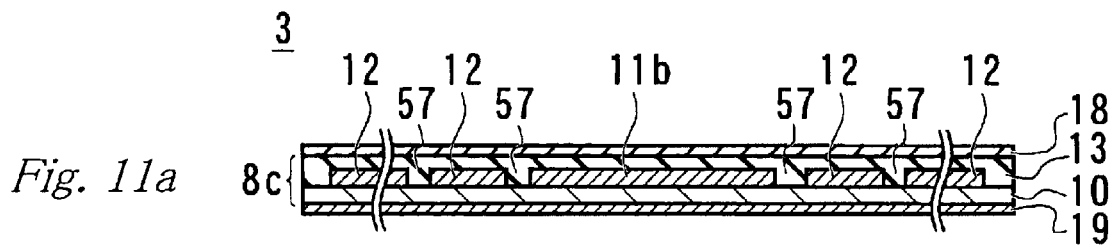
FIG. 11(a) is a sectional view taken along $C_1$—$C_1$ line in FIG. 10.
Figure 11B:
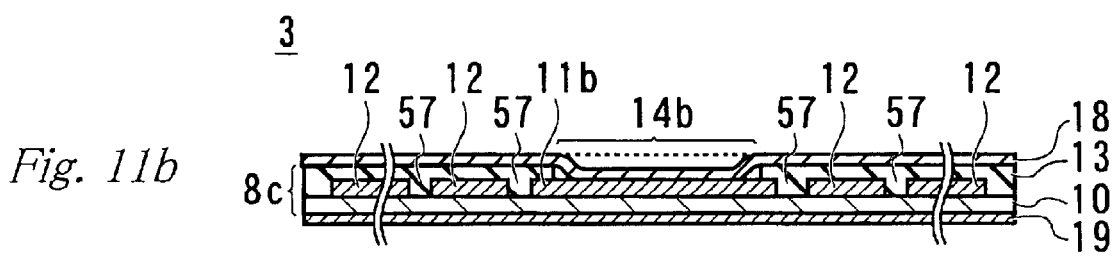
FIG. 11(b) is a sectional view taken along $C_2$—$C_2$ line in FIG. 10.
Figure 11C:
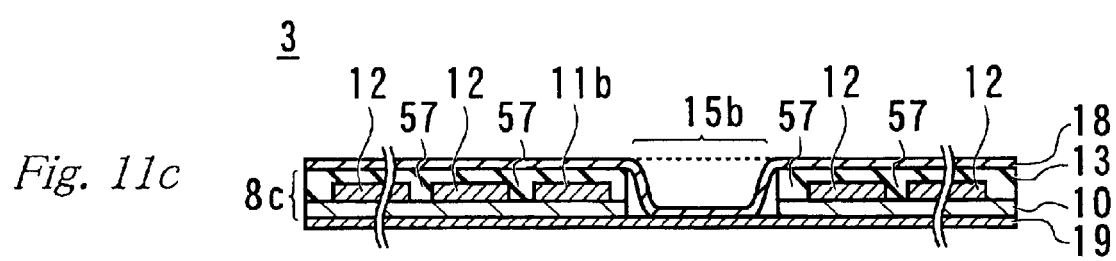
FIG. 11(c) is a sectional view taken along $C_3$—$C_3$ line in FIG. 10.
Figure 11D:
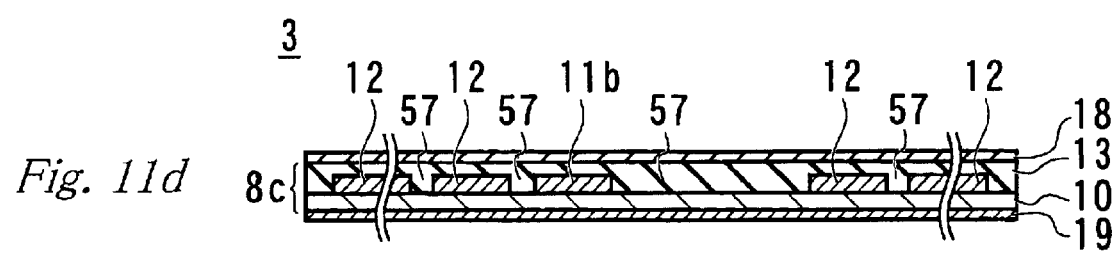
FIG. 11(d) is a sectional view taken along $C_4$—$C_4$ line in FIG. 10.

FIG. 11(a) is a sectional view taken along $C_1$—$C_1$ line passing through the wide area of conductor part 61b of ground wiring 11b not containing opening 14b, FIG. 11(b) is a sectional view taken along $C_2$—$C_2$ line passing through opening 14b, FIG. 11(c) is a sectional view taken along $C_3$—$C_3$ line passing through through-hole 15b, and FIG. 11(d) is a sectional view taken along $C_4$—$C_4$ line passing through the narrow area of conductor part 61b not containing through-hole 15b. Reference 8c in FIGS. 11(a)–(d) represents a wiring board body comprising base film 10, ground wiring 11b and signal wirings 12 and cover film 18.

Similarly to wiring boards 1, 2 of the first and second examples, first shield film 18 applied on cover film 13 is directly connected to ground wiring 11b at the bottom of opening 14b and second shield film 19 applied on base film 10 is connected to ground wiring 11b via first shield film 18 in wiring board 3 of this third example.

Although wiring boards of the first to third examples described above are single-sided flat cables, wiring boards of the present invention also include double-sided flat cables.

Figure 12A:
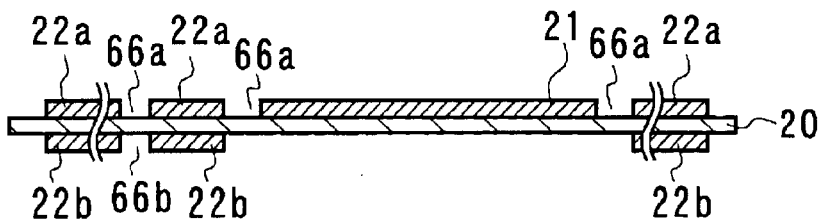
FIG. 12(a) is a diagram for illustrating a step (1) of a process for manufacturing a wiring board of a fourth example of the present invention.

FIGS. 12(a)–(e) are sectional views for illustrating a process for manufacturing a double-sided flat cable included in the present invention. Referring to FIG. 12(a), ground wiring 21 having a wide conductor part and signal wirings 22a having a narrow conductor part are provided on the surface side of base film 20 made of the same resin as that of base film 10 of Examples 1–3. On the rear surface side of base film 20 are provided signal wirings 22b having a narrow conductor part. Individual signal wirings 22a on the surface side, signal wirings 22a and ground wiring and individual signal wirings 22b on the rear surface side are separated from each other by grooves 66a, 66b.

Figure 12B:
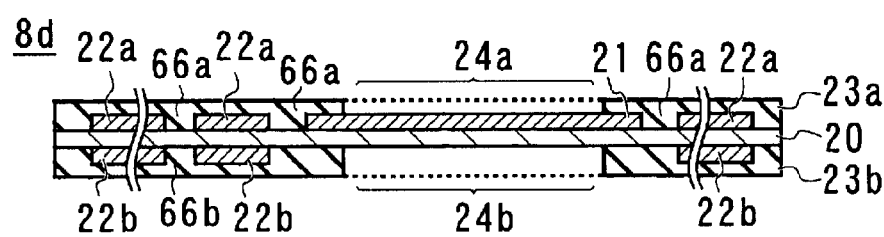
FIG. 12(b) is a diagram for illustrating a step (2) of the process for manufacturing the wiring board of the fourth example of the present invention.

Starting from this state, two cover films 23a, 23b having openings 24a, 24b are first applied on the surface side and the rear surface side of base film 20 to form wiring board body 8d as shown in FIG. 12(b) while adjusting the alignment in such a manner that openings 24a, 24b are located on the surface and the rear surface of ground wiring 21.

In this wiring board body 8d, the surface side of ground wiring 21 is exposed at the bottom of opening 24a in cover film 23a on the surface of base film 20.

Figure 12C:
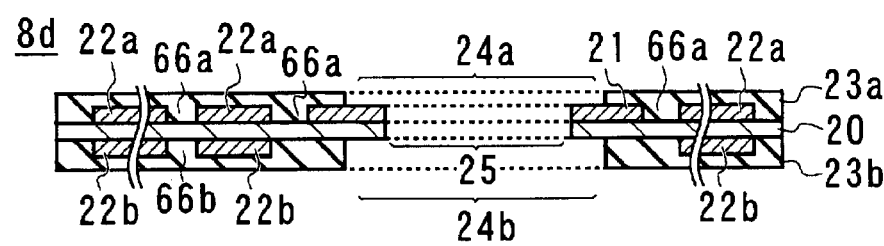
FIG. 12(c) is a diagram for illustrating a step (3) of the process for manufacturing the wiring board of the fourth example of the present invention.

Then, the bottom of opening 24a is pierced to form a through-hole 25 having a diameter smaller than that of opening 24a in ground wiring 21 and base film 10 among components of wiring board body 8d, as shown in FIG. 12(c). In this state, openings 24a, 24b and through-hole 25 at the bottom penetrate from the surface to the rear surface of base film 20.

Figure 12D:
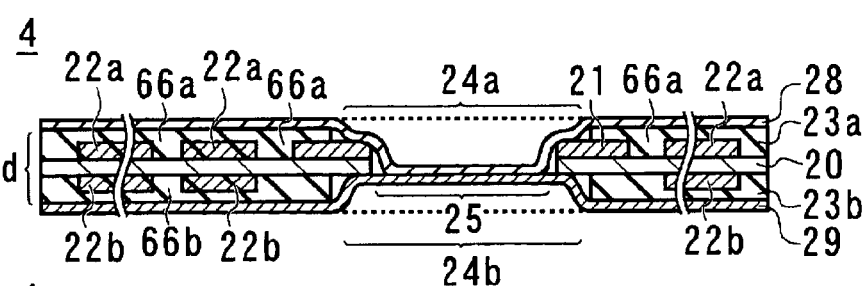
FIG. 12(d) is a diagram for illustrating a step (4) of the process for manufacturing the wiring board of the fourth example of the present invention.

Then, first and second shield films 28, 29 made of a metal foil are applied on the surfaces of cover films 23a, 23b, and first shield film 28 overlying ground wiring 21 is pressed and pushed into a hole consisting of openings 24a, 24b and through-hole 25 so that first shield film 28 is adhered and electrically connected to the surface of ground wiring 21 exposed at the bottom of opening 24a, as shown in FIG. 12(d).

During this, second shield film 29 on the rear surface side of base film 20 is pushed into opening 24b so that first and second shield films 28, 29 are adhered and electrically connected to each other. As a result, second shield film 29 on the rear surface side of base film 20 is also electrically connected to ground wiring 21 to form a shielded wiring board 4 having signal wirings 22a, 22b on both sides.

Although both first and second shield films 28, 29 here are pushed, only first shield film 28 may be pushed and connected to ground wiring 21 and second shield film 29.

Figure 12E:
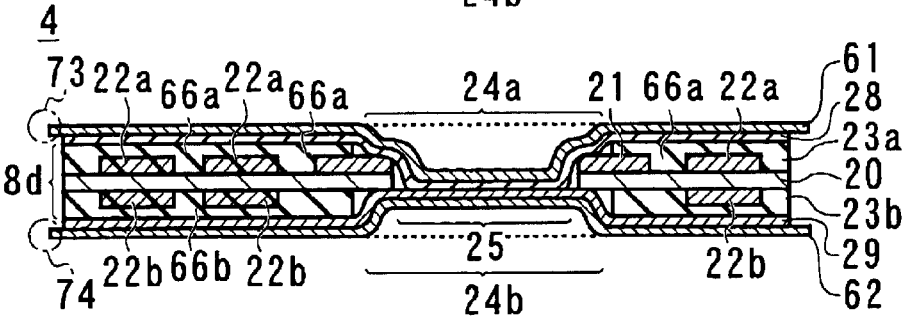
FIG. 12(e) is a diagram for illustrating a step (5) of the process for manufacturing the wiring board of the fourth example of the present invention.

Protective films 61, 62 can be applied on first and second shield films 28, 29 of this wiring board 4, as shown in FIG. 12(e). References 73, 74 represent projections of protective films 61, 62 over first and second shield films 28, 29. In this wiring board 4, terminal parts at both ends of ground wiring 21 and signal wirings 22 are exposed.

Next, a wiring board of a fifth example of the present invention is explained together with the manufacturing process.

Referring to FIG. 13(a), a copper foil is applied on base film 30 made of a resin and patterned by etching to form ground wiring 31 having a wide conductor part and signal wirings 32 having a narrow conductor part. Ground wiring 31 and signal wirings 32 are separated by grooves 76 formed by removing the copper foil as well as individual signal wirings 32.

As shown in FIG. 13(b), cover film 33 is applied on the surface of base film 30 having ground wiring 31 and signal wirings 32 to prepare a wiring board body 8e. In this wiring board body 8e, terminal parts at both ends of ground wiring 31 and signal wirings 32 are exposed while conductor parts connecting terminals at both ends are covered with cover film 33.

Then, resist films 34a, 34b are applied on both sides of wiring board body 8e, respectively, as shown in FIG. 13(c), and then wiring board body 8e is pierced at a location containing a stack of ground wiring 31 and cover film 33 to form a hole 35 having a diameter smaller than the width of ground wiring 31, as shown in FIG. 13(d). This hole 35 penetrates resist films 34a, 34b, cover film 33, ground wiring 31 and base film 30.

The assembly as such is immersed in a plating pretreatment solution containing a catalyst such as carbon particles dispersed therein to remove resist films 34a, 34b, and then it is immersed in a copper plating solution so that copper grows on the inner circumferential face of hole 35. Reference 37 in FIG. 13(e) represents a metal film consisting of copper grown on the inner circumferential face of hole 35. The cut section of ground wiring 31 is exposed on the inner circumferential face of hole 35 and metal film 37 grows on the face containing the cut section of ground wiring 31, whereby metal film 37 is electrically connected to ground wiring 31.

Then, first and second shield films 38, 39 are applied on the surfaces of cover film 33 and base film 30 and either one or both of first and second shield films 38, 39 overlying hole 35 is pressed and pushed into hole 35, whereby first and second shield films 38, 39 are adhered and electrically connected to each other, as shown in FIG. 13(f).

During this, first and second shield films 38, 39 are connected to metal film 37 at the surface of opening of hole 35 and the pushed first shield film 38 is connected to metal film 37 on the inner circumferential face of hole 35 to give a shielded wiring board 5.

As shown in FIG. 13(g), protective films 71, 72 can also be applied on the surfaces of wiring board 5 of this fifth example. Insulating protective films 71, 72 can also be provided with projections 83, 84.

Although holes 35, 15, 25 are formed inside ground wirings 31, 11, 21 in wiring board 5 of this fifth example and wiring boards 1–4 in the first to fourth example, holes 35, 15, 25 may be formed to partially cut out ground wirings 31, 11, 21.

Similarly to wiring board 4 of the fourth example, wiring board 5 of the fifth example and wiring boards 1–3 of the first to third examples, signal wirings 12, 32 can be provided on both sides of base films 30, 10. Ground wirings 11, 11b, 31 may be provided on both sides.

Next, a process for manufacturing a wiring board of a sixth example of the present invention is explained.

Figure 14A:
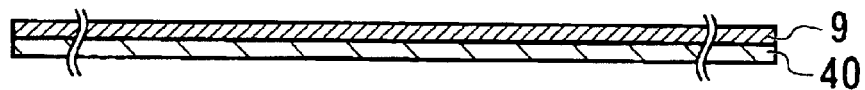
FIG. 14(a) is a diagram for illustrating a step (1) of a process for manufacturing a wiring board of a sixth example of the present invention.
Figure 14B:
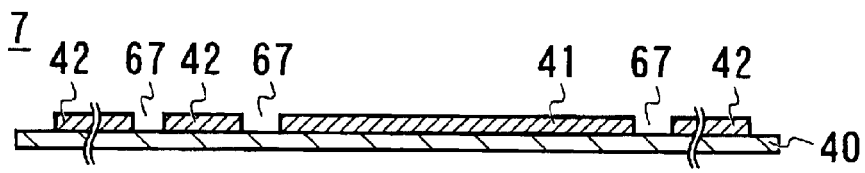
FIG. 14(b) is a diagram for illustrating a step (2) of the process for manufacturing the wiring board of the sixth example of the present invention.

Referring to FIGS. 14(a)–(f), copper foil 9 is first applied on base film 40 as described in the examples above (FIG. 14(a)), and copper foil 9 is patterned. References 41, 42 in FIG. 14(b) represent ground wiring and signal wirings having the same pattern as shown in FIGS. 2–4 and separated by grooves 67.

Figure 14C:
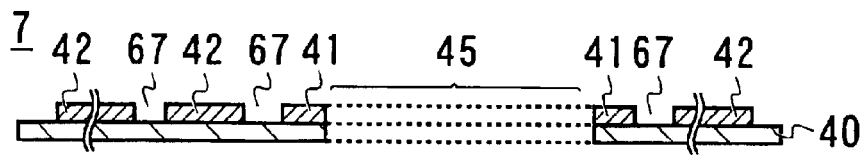
FIG. 14(c) is a diagram for illustrating a step (3) of the process for manufacturing the wiring board of the sixth example of the present invention.

After patterning, the wide part of ground wiring 41 is pierced to form a through-hole 45 shown in FIG. 14(c). This through-hole 45 penetrates ground wiring 41 and base film 40.

Figure 14D:
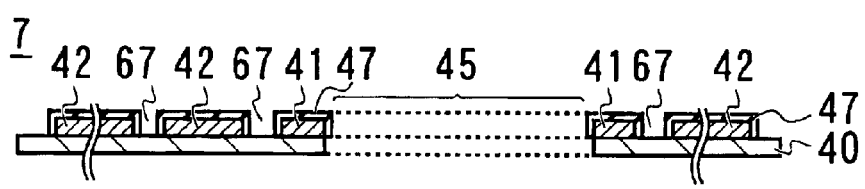
FIG. 14(d) is a diagram for illustrating a step (4) of the process for manufacturing the wiring board of the sixth example of the present invention.

In this state, a copper plating film 47 is grown on the surfaces and sides of ground wiring 41 and signal wirings 42, as shown in FIG. 14(d).

Figure 14E:
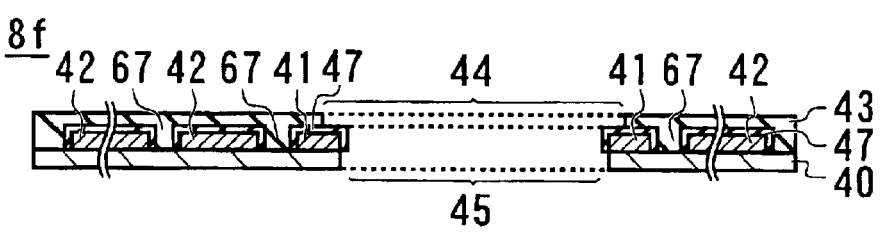
FIG. 14(e) is a diagram for illustrating a step (5) of the process for manufacturing the wiring board of the sixth example of the present invention.
Figure 14F:
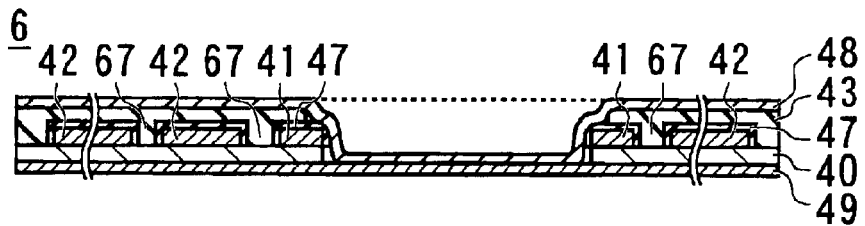
FIG. 14(f) is a diagram for illustrating a step (6) of the process for manufacturing the wiring board of the sixth example of the present invention.
Figure 15:
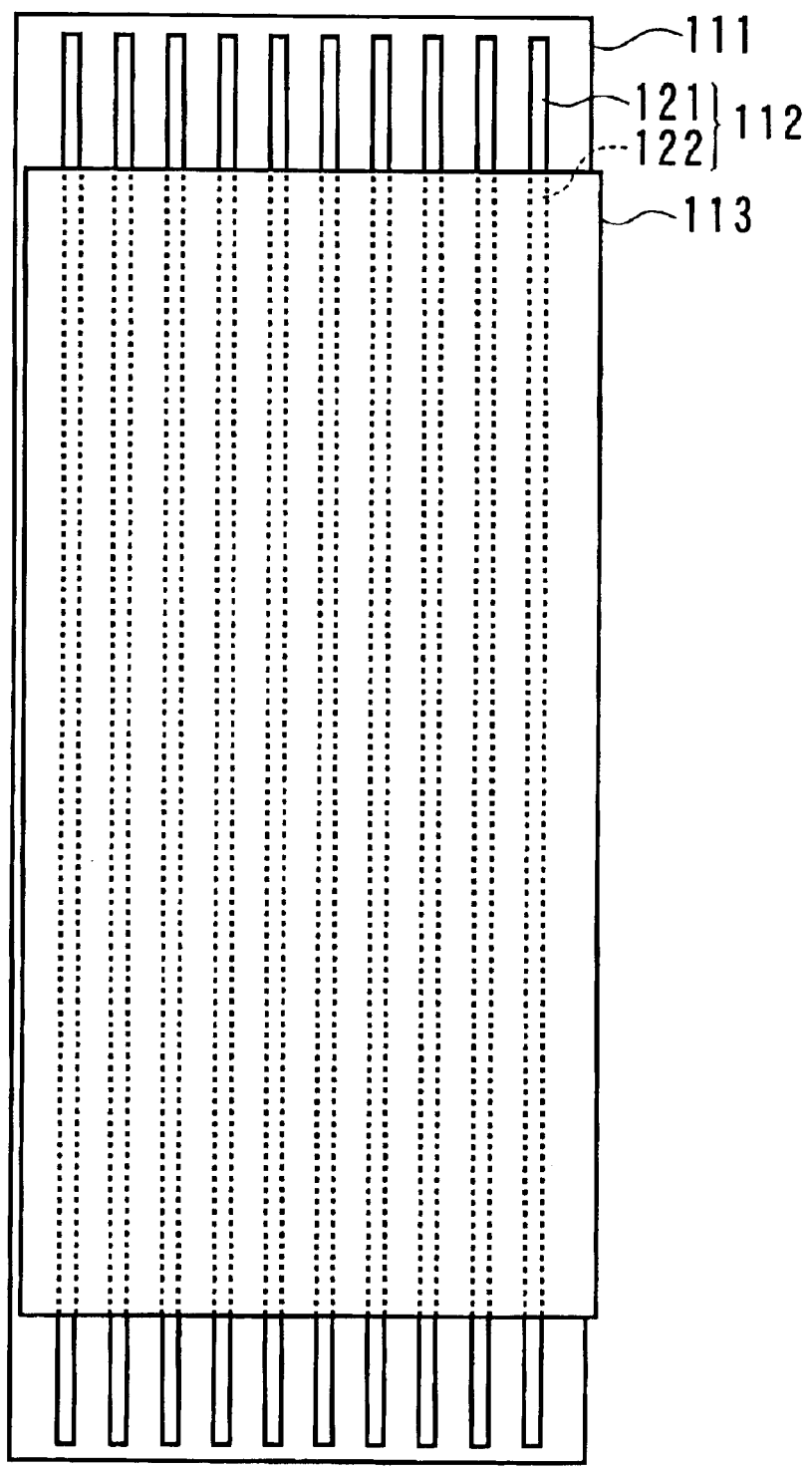
FIG. 15 is a diagram for illustrating a wiring board of the prior art.

Then, cover film 43 made of the same resin film as used in Examples 1–5 described above and having a window for exposing terminal parts of ground and signal wirings 41, 42 and an opening 44 having a diameter equal to or greater than that of through-hole 45 is prepared and aligned so that opening 44 overlies through-hole 45, and cover film 43 is applied on the surfaces of ground and signal wirings 41, 42 and base film 40 exposed between them (FIG. 14(e)).

In this state, opening 44 and through-hole 45 penetrate from the surface to the rear surface of wiring board body 8f, and first and second shield films 48, 49 having a conductive adhesive layer are applied on both sides of wiring board body 8f and first shield film 48 is pushed into a hole formed of opening 44 and through-hole 45 to give a wiring board 6 of the present invention.

As a copper plating layer 47 is formed at the cut section of ground wiring 41 exposed at the inner circumferential face of through-hole 45, first shield film 48 is connected to copper plating layer 47 at least at inner circumferential face of through-hole 45 or at the surface of ground wiring 41 located at the bottom of opening 44.

First shield film 48 and second shield film 49 are adhered to each other at the bottom of through-hole 45, whereby both first and second shield films 48, 49 are connected to ground wiring 41. Protective films may be applied on the surfaces of first and second shield films 48, 49.

Copper plating layer 47 may be replaced by a plating layer of a desired metal such as gold, platinum and solder.

Wiring boards 1–6 described above are flexible flat cables that can be freely folded within the breaking limit.

Although a metal foil is used in the shield film in the foregoing examples, the present invention is not limited thereto but any conductive films can be used. Line films are not limited to copper, either, so far as they are conductive. For example, aluminium can be used.

Although the foregoing examples relate to wiring boards in which a plurality of lines are insulated from each other, the present invention also includes flexible wiring boards in which some lines are connected to each other and wiring boards comprising a wiring board of the present invention bonded to another wiring board.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A wiring board comprising a wiring board body having a base film, a plurality of metal lines provided on the base film and a cover film provided on a side of the base film having the metal lines, and a first shield film and a second shield film provided on a side of the wiring board body having the cover film and the opposite side, respectively,
   wherein the cover film has an opening formed at a predetermined location above the metal lines so that the first shield film is connected to the metal line exposed under the opening, the wiring board body has a through-hole penetrating at least the base film and the cover film, and either one or both of the first and second shield films are pushed into the through-hole so that the first and second shield films are connected to each other.

2. The wiring board of claim 1, wherein the through-hole also penetrates the metal line in addition to the cover film and the base film.

3. The wiring board of claim 2, wherein the through-hole and the opening at least partially overlap each other.

4. The wiring board of claim 3, wherein the through-hole is smaller than the opening and the through-hole is provided inside the opening.

5. The wiring board claim 1, wherein the metal lines are provided on both sides of the base film.

6. The wiring board of claim 1, wherein the metal lines comprise a plurality of signal wirings and at least one ground wiring wider than the signal wirings at least at the center area and the opening is provided above the ground wiring.

7. The wiring board of claim 6, wherein the signal wirings have a narrow conductor part and a terminal part connected to each end of the narrow conductor part and wider than the narrow conductor part.

8. The wiring board of claim 7, wherein the ground wiring has a wide conductor part and a terminal part connected to each end of the wide conductor part and narrower than the wide conductor part, and the terminal part of the signal wirings and the terminal part of the ground wiring have approximately the same width.

9. The wiring board of claim 6, wherein the ground wiring has a wide conductor part and a terminal part connected to each end of the wide conductor part and narrower than the wide conductor part.

10. The wiring board of claim 9, wherein the through-hole penetrates the wide conductor part of the ground wiring.

11. A wiring board comprising a wiring board body having a base film, a plurality of metal lines provided on the base film and a cover film provided on a side of the base film having the metal lines, and a first shield film and a second shield film provided on a side of the wiring board body having the cover film and the opposite side, respectively, wherein the wiring board body has a through-hole provided at a predetermined location on the metal lines and penetrating the base film, the cover film and the metal line, a metal film is formed on an inner circumferential face of the through-hole and connected to the metal line exposed on the inner circumferential face of the through-hole, and either one or both of the first and second shield films are pushed into the through-hole so that the first and second shield films are connected to each other and at least one shield film is connected to the metal film.

12. The wiring board of claim 11, wherein the metal lines are both sides of the base film.

13. A wiring board comprising a wiring board body having a base film, a plurality of metal lines provided on the base film and a cover film provided on a side of the base film having the metal lines, and a first shield film and a second shield film provided on a side of the wiring board body having the cover film and the opposite side, respectively, wherein the cover film has an opening formed at a predetermined location above the metal lines so that the first shield film is connected to the metal line exposed under the opening, the wiring board body has a through-hole penetrating at least the base film and the cover film so that the first and second shield films are connected to each other via the through-hole, the through-hole also penetrates the metal line in addition to the cover film and the base film, and the through-hole and the opening at least partially overlap each other, wherein the metal lines comprise a plurality of signal wirings and at least one ground wiring wider than the signal wirings at least at a center area of the base film and the opening is provided above the ground wiring, wherein the signal wirings have a narrow conductor part and a terminal part connected to each end of the narrow conductor part and wider than the narrow conductor part.

14. The wiring board of claim 13 wherein the through-hole is smaller than the opening and the through-hole is provided inside the opening.

15. The wiring board of claim 13 wherein the ground wiring has a wide conductor part and a terminal part connected to each end of the wide conductor part and narrower than the wide conductor part.

16. The wiring board of claim 15 wherein the through-hole penetrates the wide conductor part of the ground wiring.

17. The wiring board of claim 13 wherein the ground wiring has a wide conductor part and a terminal part connected to each end of the wide conductor part and narrower than the wide conductor part, and the terminal part of the signal wirings and the terminal part of the ground wiring have approximately the same width.

* * * * *